(12) United States Patent
Feng et al.

(10) Patent No.: US 9,447,943 B2
(45) Date of Patent: Sep. 20, 2016

(54) HIGH TEMPERATURE MOLDABLE LENS, LIGHTING DEVICE COMPRISING LENS AND METHOD MAKING LIGHTING DEVICE

(75) Inventors: Yaojun Feng, Shenzhen (CN); Chenglong Dai, Shenzhen (CN); Yubao He, Shenzhen (CN); Yabin Luo, Shenzhen (CN)

(73) Assignee: OSRAM GmbH, Munich (DE)

( * ) Notice: Subject to any disclaimer, the term of this patent is extended or adjusted under 35 U.S.C. 154(b) by 588 days.

(21) Appl. No.: 13/877,287

(22) PCT Filed: Sep. 5, 2011

(86) PCT No.: PCT/EP2011/065257
§ 371 (c)(1),
(2), (4) Date: Apr. 1, 2013

(87) PCT Pub. No.: WO2012/041639
PCT Pub. Date: Apr. 5, 2012

(65) Prior Publication Data
US 2013/0201694 A1     Aug. 8, 2013

(30) Foreign Application Priority Data

Sep. 30, 2010 (CN) .......................... 2010 1 0512096

(51) Int. Cl.
*F21V 5/04* (2006.01)
*G02B 3/04* (2006.01)
(Continued)

(52) U.S. Cl.
CPC .............. *F21V 5/04* (2013.01); *B29D 11/0073* (2013.01); *G02B 3/04* (2013.01); *G02B 7/025* (2013.01);
(Continued)

(58) Field of Classification Search
CPC ............... H01L 21/50; H01L 31/0232; H01L 31/02325; H01L 31/02327; H01L 33/58; H01L 25/167; H01L 27/00; H01L 27/14623; H01L 27/14683; H01L 33/486; H01L 33/00; H01L 2933/0058; H01L 31/0203; H04N 5/2254; G02B 27/0006; G02B 19/0014; G02B 3/04; B29L 2011/0016; F21V 5/08; F21V 5/04; F21V 5/046
See application file for complete search history.

(56) References Cited

U.S. PATENT DOCUMENTS

| 6,122,009 A * | 9/2000 | Ueda ................. H01L 27/14618 348/335 |
| 7,326,902 B2 * | 2/2008 | Nishikawa ........ H01L 27/14618 250/208.1 |
| 2010/0025792 A1 * | 2/2010 | Yamada ............... G02B 13/001 257/432 |

FOREIGN PATENT DOCUMENTS

| CN | 101440928 | 5/2009 |
| CN | 101620281 | 1/2010 |

(Continued)

*Primary Examiner* — Hargobind S Sawhney
(74) *Attorney, Agent, or Firm* — Cozen O'Connor

(57) ABSTRACT

A lens configured to a lighting device, comprising an optical part (1) and a mechanical part (2) surrounding the optical part (1), wherein, the mechanical part (2) comprises a blocking protrusion (3) protruding in a direction parallel to the optical axis (4) of the lens, surrounding the optical part (1) and spaced apart from the optical part (1). This type of lens can effectively prevent the optical part from being damaged, for example, in a low pressure molding process, by a hot liquid glue, improve the yield of the lighting device, and have fine waterproof ability at the same time. Also disclosed is a lighting device having this type of lens, and the lighting device has beautiful appearance and fine waterproof effect. A method configured to make this lighting device is also disclosed.

12 Claims, 3 Drawing Sheets

(51) Int. Cl.
- G02B 7/02 (2006.01)
- H01L 33/58 (2010.01)
- G02B 19/00 (2006.01)
- B29D 11/00 (2006.01)
- H01L 31/0232 (2014.01)
- B29L 11/00 (2006.01)
- B29L 31/34 (2006.01)
- H01L 33/56 (2010.01)
- B29C 65/54 (2006.01)

(52) U.S. Cl.
CPC ....... G02B 19/0014 (2013.01); G02B 19/0061 (2013.01); H01L 33/58 (2013.01); *B29C 65/542* (2013.01); *B29L 2011/0016* (2013.01); *B29L 2031/3425* (2013.01); *H01L 31/0232* (2013.01); *H01L 33/56* (2013.01); *H01L 2933/0058* (2013.01)

(56) References Cited

FOREIGN PATENT DOCUMENTS

| | | |
|---|---|---|
| EP | 0 585 186 | 3/1994 |
| EP | 1 148 716 | 10/2001 |
| EP | 1 383 175 | 1/2004 |
| EP | 1 467 416 | 10/2004 |
| JP | 2006 080251 | 3/2006 |

\* cited by examiner

HIGH TEMPERATURE MOLDABLE LENS, LIGHTING DEVICE COMPRISING LENS AND METHOD MAKING LIGHTING DEVICE

RELATED APPLICATIONS

This is a U.S. national stage of application No. PCT/EP2011/065257 filed on Sep. 5, 2011.

This patent application claims the priority of Chinese application no. 201010512096.1 filed Sep. 30, 2010, the disclosure content of which is hereby incorporated by reference.

FIELD OF THE INVENTION

The present invention relates to a lens configured to a lighting device. In addition, the present invention also relates to a lighting device comprising this lens and a method of making the lighting device.

BACKGROUND OF THE INVENTION

The backlight module of current LED advertising boards is usually made with a low pressure molding technology. The LED module made using this process has a beautiful appearance, high integration and fine waterproof properties. During using an LED module to make the backlight module of an advertising board, to obtain fine optical properties, usually an additional lens needs to be mounted at the LED module. To mount this type of lens, one manner disclosed in the prior art is that the lens is first mounted at a PCB board with an LED assembly and then the PCB board is placed in a mould in which a liquid plastic (hot) is perfused. However, in this process, the hot liquid plastic will damage the lens. Another known technical means is that an LED module has two covers which form a cavity for receiving a PCB board, and a lens is integrated at one of the covers and an opening is provided in the other cover for perfusing the liquid glue (not hot). During making, the liquid glue is injected into the cavity via the opening and is solidified therein. Although this method will not damage the lens, it uses too many components, with a high cost and complex assembling.

SUMMARY OF THE INVENTION

One object of the present invention aims to provide a lens configured to a lighting device. This type of lens can effectively prevent an optical part from being damaged, for example, in a low pressure molding process, by a hot liquid glue, improve the yield of the lighting device, and have fine waterproof effect at the same time.

This and other objects are attained in accordance with one aspect of the present invention directed to a lens, i.e., the lens comprises an optical part and a mechanical part surrounding the optical part, wherein, the mechanical part comprises a blocking protrusion protruding in a direction parallel to the optical axis of the lens, surrounding the optical part and spaced apart from the optical part. When the lighting device such as an LED module is packaged using a low pressure molding process, a hot liquid glue, blocked by the blocking protrusion, will not flow to the zone of the optical part, thus preventing the optical part from being damaged by the hot liquid glue and improving the yield of the lighting device, and also, the LED module packaged using the low pressure molding process has fine waterproof ability.

In a preferable design according to the present invention, the blocking protrusion is formed in one-piece with the mechanical part. This greatly reduces the numberof components and lowers production cost.

In another design according to the present invention, the blocking protrusion and the mechanical part are formed separately. The blocking protrusion is made from a high temperature resistant material. This further improves the heat resistance ability of the lens, effectively prevents the blocking protrusion from being damaged and ensures that the hot liquid glue will not enter the zone of the optical part.

In a preferable design according to the present invention, in the direction of the optical axis of the lens, the blocking protrusion is lower than the optical part in height, and thus the blocking protrusion will not disturb the light projection of the optical part while effectively preventing the liquid glue from entering the optical part.

According to a preferable design of the present invention, a incident surface of an lens comprises a rotatably symmetric concave zone, a light emitting assembly of the lighting device is provided in the concave zone, and a lens exit surface of the optical lens comprises a central zone with concave bending and an edge zone with convex bending, and the central zone has a smooth transition towards the edge zone. This type of lens structure can obtain a specific form of lighting pattern.

Preferably, the lens according to the present invention is made from any one of polycarbonate (PC), methyl methacrylate-styrene copolymer (NAS), nylon, ADC plastic (CR-39), polystyrene, styrene-acrylonitrile copolymer or silicon dioxide. Of course, they can be made from other materials having fine transmittance to try to reduce the light loss of the light when passing through the light mixing element.

Another object of the present invention is to provide a backlight lighting module which comprises the above lens. The lighting module according to the present invention has a beautiful appearance and fine waterproof effect.

The last object of the present invention is to provide a method configured to make a lighting module, comprising the following steps: a) providing a lens, and forming at a mechanical part of the lens a blocking protrusion protruding in a direction parallel to an optical axis of the lens, surrounding the optical part of the lens and spaced apart from the optical part; b) placing a lighting assembly mounted with the lens in a mould, and applying the radial outer side of the blocking protrusion to abut against the edge of an opening of the mould; c) perfusing a high temperature liquid glue into the mould; and d) removing the mould after the high temperature liquid glue has been solidified. In the method according to the present invention, the blocking protrusion closely abuts against the edge of the opening of the mold, which effectively prevents the hot liquid glue from entering the optical part of the lens and thus improves the yield of the product. Also, the lighting device made using this process has fine waterproof ability and a more beautiful appearance.

In a preferable design of the method according to the present invention, in step b), the optical part of the lens is covered via an additional mould. The optical part is further protected via a protective mold, and then will not be damaged even some hot liquid glue gets across the blocking protrusion.

According to a preferable design of the present invention, in step a), the blocking protrusion is formed in one-piece with the mechanical part of the lens. This greatly reduces the number of components and lowers production cost.

According to another design of the present invention, in step a), the blocking protrusion is separately formed at the mechanical part of the lens. This further improves the heat resistance ability of the lens, effectively prevents the blocking protrusion from being damaged and ensures that the hot liquid glue will not enter the zone of the optical part.

It should be understood that the above general description and the following detailed description are for listing and explanation, and aim to provide further explanation of the claimed invention.

BRIEF DESCRIPTION OF THE DRAWINGS

The accompanying drawings constitute a part of the Description and are used to provide further understanding of the present invention. Such accompanying drawings illustrate the embodiments of the present invention and are used to describe the principles of the present invention together with the Description. In the accompanying drawings the same components are represented using the same reference. As shown in the drawings.

DETAILED DESCRIPTION OF THE EMBODIMENTS

Figure 1:
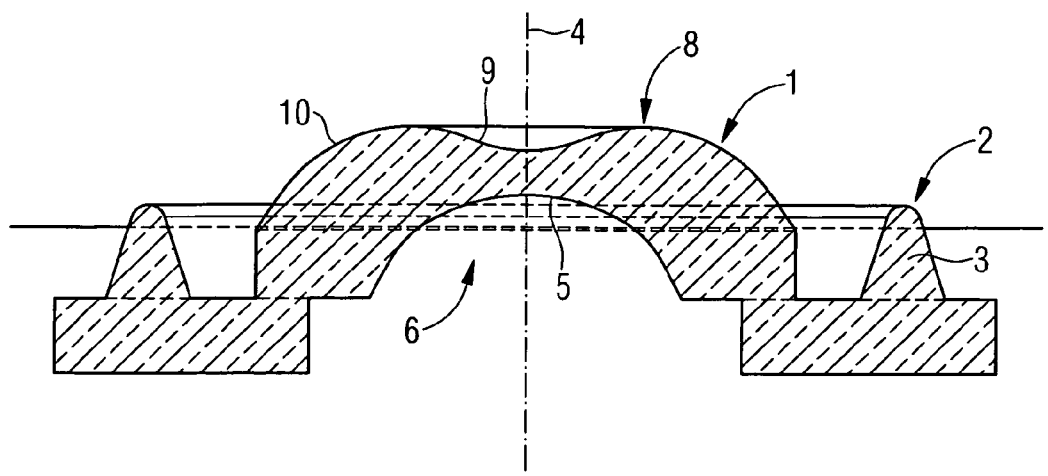
FIG. 1 is a sectional view of the lens according to the present invention.

FIG. 1 is a sectional view of the lens according to the present invention. Seen from FIG. 1, the lens comprises an optical part 1 and a mechanical part 2 surrounding the optical part 1, wherein, the mechanical part 2 comprises a blocking protrusion 3 protruding in a direction parallel to the optical axis 4 (shown with dashed lines) of the lens, surrounding the optical part 1 and spaced apart from the optical part 1. In this embodiment, the blocking protrusion 3 is formed in one-piece with the mechanical part 2, and of course, the blocking protrusion 3 and the mechanical part 2 can also be formed separately. In addition, seen from FIG. 1, an incident surface 5 of the lens comprises a rotatably symmetric concave zone 6, and a light emitting assembly 7 (LED assembly) is provided in the concave zone 6. In addition, an exit surface 8 of the lens comprises a central zone 9 with concave bending and an edge zone 10 with convex bending, and the central zone 9 has a smooth transition towards the edge zone 10.

Figure 2:
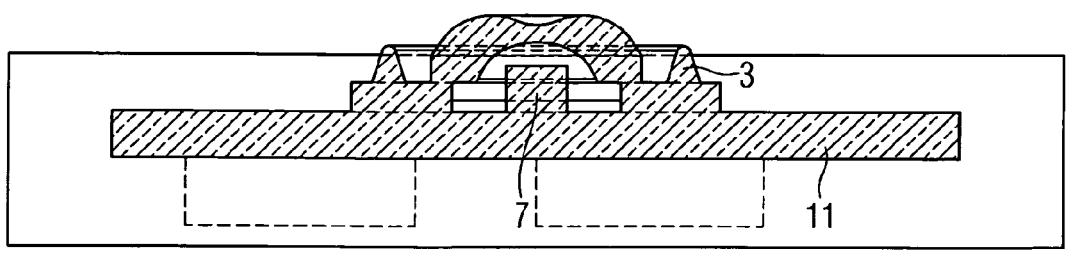
FIG. 2 is a sectional view of the lighting device mounted with the lens according to the present invention.

FIG. 2 is a sectional view of the lighting device mounted with the lens according to the present invention. The lens is mounted at PCB board 11 of the lighting device which is packaged with plastic or other packing materials. Seen from the figure, the blocking protrusion 3 blocks the packing material, and at the inner side of the blocking protrusion 3, i.e., the side facing the optical part 1 of the lens, there exists no packing material.

Figure 3:
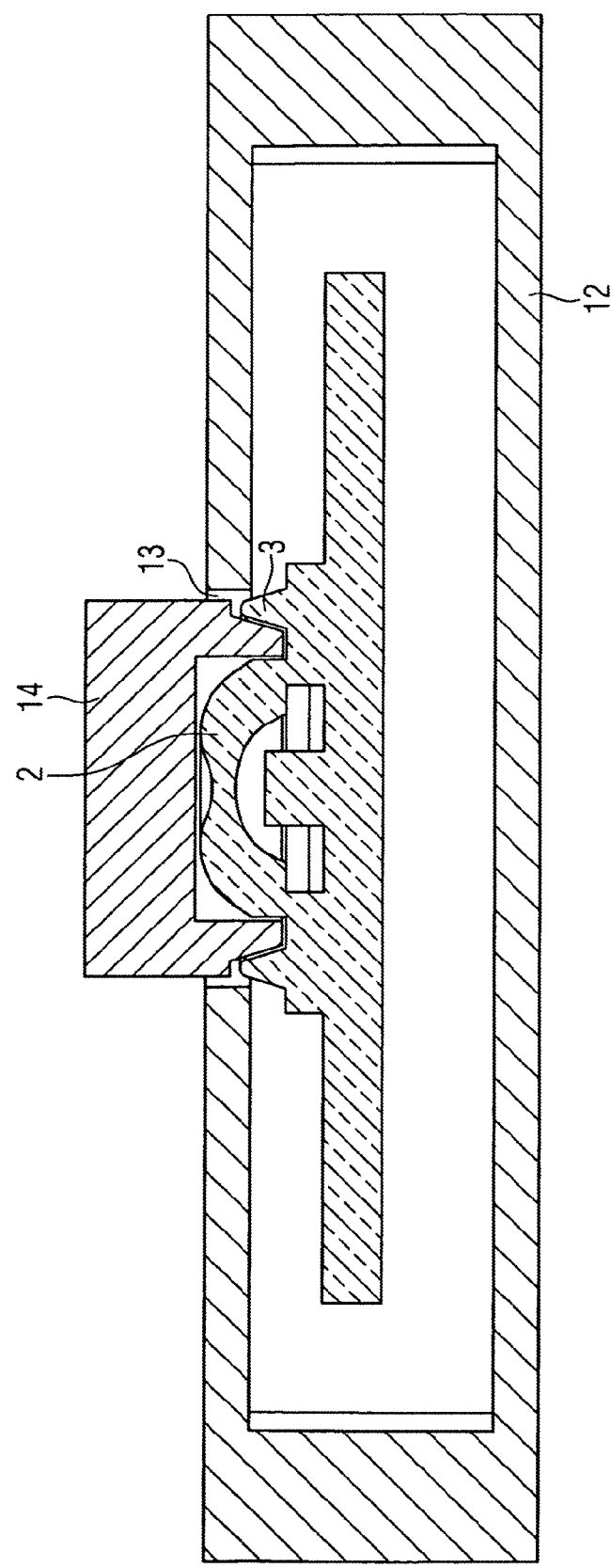
FIG. 3 is a schematic view of the method of making the lighting device using a mold according to the present invention.

FIG. 3 is a schematic view of the method of making the lighting device using a mold according to the present invention. Seen from the figure, the lighting device mounted with the lens has been placed in the mould 12 which has an opening 13, the outer side surface of the blocking protrusion 13 of the lens abuts against the edge of the opening 13 of the mould 12, thereby restricting that the hot liquid glue gets across the blocking protrusion 3 and then enters the zone of the optical part 1 of the lens. Also, the optical part 1 of the lens is coated with a protective mound 14, and then will not be damaged even part of the hot liquid glue gets across the blocking protrusion 3.

Figure 4:
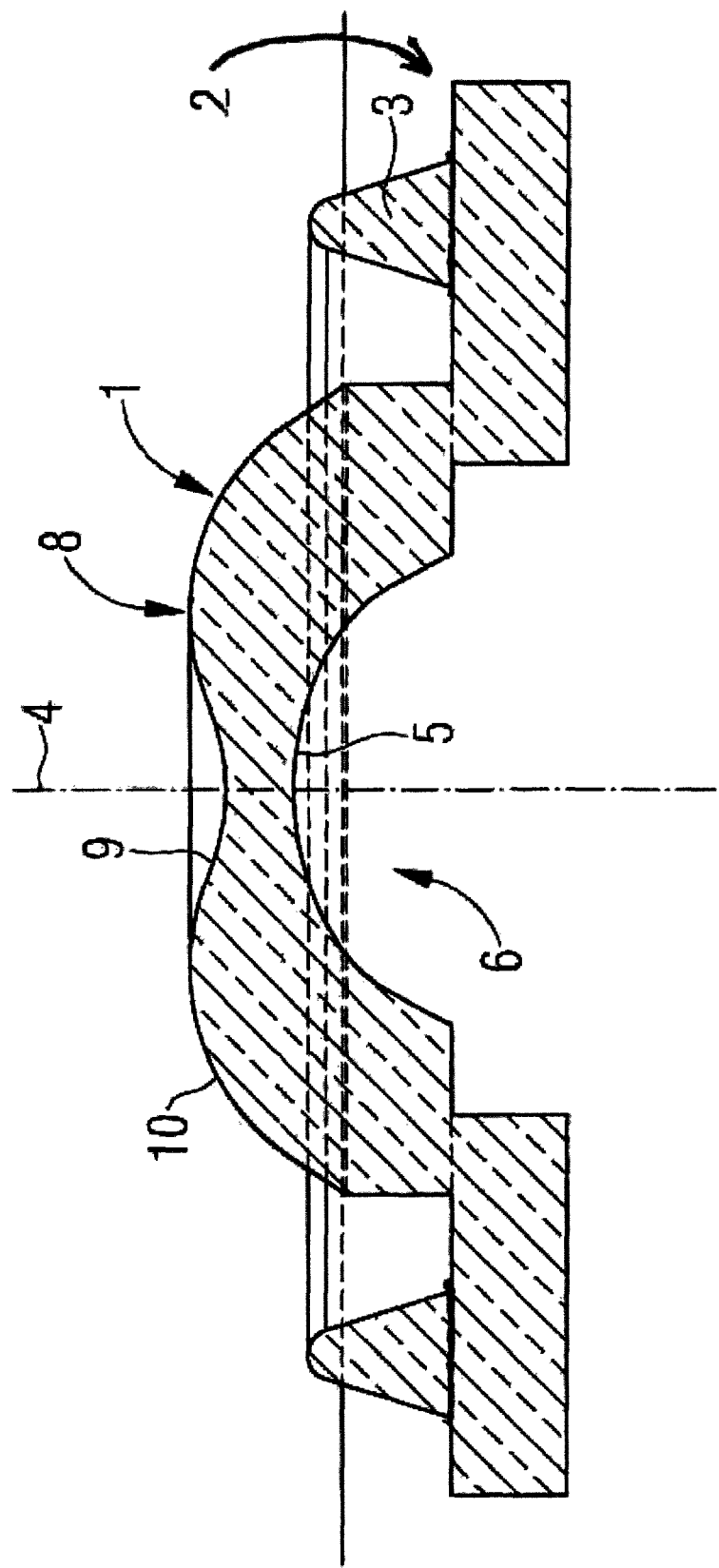
FIG. 4 is a sectional view of the lens according to a second embodiment of the present invention.

FIG. 4 is a sectional view of the lens according to a second embodiment of the present invention. In the embodiment of FIG. 4, instead of the blocking protrusion 3 being formed in one-piece with the mechanical part 2, as in FIG. 1, the blocking protrusion 3 and the mechanical part 2 are formed separately. In all other respects, the embodiment of FIG. 4 is the same as that of FIG. 1.

The descriptions above are only preferable embodiments of the present invention and are not used to restrict the present invention. For those skilled in the art, the present invention may have various changes and variations. Any modifications, equivalent substitutions, improvements etc. within the spirit and principle of the present invention shall all be included in the scope of protection of the present invention.

The invention claimed is:

1. A lens configured to a lighting device, comprising;
an optical part; and
a mechanical part,
wherein the mechanical part comprises a blocking protrusion:
protruding so as to at least partially overlap the optical part in a direction parallel to the optical axis of the lens, and
surrounding the optical part and spaced apart from the optical part.

2. The lens according to claim 1, wherein the blocking protrusion is formed in one-piece with the mechanical part.

3. The lens according to claim 1, wherein the blocking protrusion and the mechanical part are formed separately.

4. The lens according to claim 3, wherein the blocking protrusion is made from a high temperature resistant material.

5. The lens according to claim 1, wherein in the direction of the optical axis of the lens, the blocking protrusion is lower than the optical part in height.

6. A lighting module comprising: the lens according to claim 1.

7. A lens configured to a lighting device, comprising:
an optical part; and
a mechanical part surrounding the optical part,
wherein the mechanical part comprises a blocking protrusion protruding in a direction parallel to the optical axis of the lens, surrounding the optical part and spaced apart from the optical part, and
wherein an incident surface of the optical part comprises at its center a rotatably symmetric concave zone, a light emitting assembly of the lighting device is provided in the concave zone, and an exit surface of the optical part comprises a central zone with concave bending and an edge zone with convex bending, and the central zone has a smooth transition towards the edge zone.

8. The lens according to claim 7, wherein the lens is made from any material of polycarbonate, methyl methacrylate-styrene copolymer (NAS), nylon, ADC plastic, (CR-39), polystyrene, styrene-acrylonitrile copolymer or silicon dioxide.

9. A method configured to make a lighting module, wherein the method comprises the following steps:
a) providing a lens, and forming at a mechanical part of the lens a blocking protrusion protruding in a direction parallel to an optical axis of the lens, surrounding the optical part and spaced apart from the optical part;

b) placing a lighting assembly mounted with the lens in a mould, and applying the radial outer side of the blocking protrusion to abut against the edge of an opening of the mould;

c) perfusing a high temperature liquid glue into the mould; and d) removing the mould after the high temperature liquid glue has been solidified.

10. The method according to claim 9, wherein in step b), the optical part of the lens is covered via a protective mould.

11. The method according to claim 9, wherein in step a), the blocking protrusion is formed in one-piece with the mechanical part of the lens.

12. The method according to claim 9, wherein in step a), the blocking protrusion is separately formed at the mechanical part of the lens.

* * * * *